United States Patent
Noriyuki et al.

(10) Patent No.: US 9,435,685 B2
(45) Date of Patent: Sep. 6, 2016

(54) PART HOLDING HEAD ASSEMBLY FOR CHIP MOUNTING DEVICE

(71) Applicant: Hanwha Techwin Co., Ltd., Changwon-si (KR)

(72) Inventors: Masaki Noriyuki, Changwon-si (KR); Takuya Tsutsumi, Changwon-si (KR); Tanijaki Masahiro, Changwon-si (KR); Susumu Kitada, Changwon-si (KR); Osamu Sugio, Changwon-si (KR); Hidemasa Koreeda, Changwon-si (KR); Tetsuo Fujihara, Changwon-si (KR)

(73) Assignee: Hanwha Techwin Co., Ltd., Changwon-Si (KR)

(*) Notice: Subject to any disclaimer, the term of this patent is extended or adjusted under 35 U.S.C. 154(b) by 0 days.

(21) Appl. No.: 14/874,692

(22) Filed: Oct. 5, 2015

(65) Prior Publication Data
US 2016/0096277 A1    Apr. 7, 2016

(30) Foreign Application Priority Data

Oct. 3, 2014   (JP) ................. 2014-205016
Oct. 3, 2014   (JP) ................. 2014-205017

(51) Int. Cl.
| | | |
|---|---|---|
| *B25J 15/06* | (2006.01) | |
| *G01J 1/04* | (2006.01) | |
| *G01D 5/30* | (2006.01) | |
| *H05K 13/04* | (2006.01) | |
| *H05K 13/08* | (2006.01) | |

(52) U.S. Cl.
CPC ............... *G01J 1/0425* (2013.01); *G01D 5/30* (2013.01); *H05K 13/0413* (2013.01); *H05K 13/08* (2013.01)

(58) Field of Classification Search
CPC ... G01J 1/0425; G01D 5/30; H05K 13/0413; H05K 13/08; B25J 19/021; B25J 19/022; B25J 19/023; B25J 19/025
USPC ........................................ 294/185; 414/752.1
See application file for complete search history.

(56) References Cited

U.S. PATENT DOCUMENTS

| 6,230,398 | B1 * | 5/2001 | Murata | H05K 13/0413 29/743 |
|---|---|---|---|---|
| 6,729,018 | B1 * | 5/2004 | Takano | H05K 13/0413 29/564.1 |
| 7,004,522 | B2 * | 2/2006 | Nagai | H01L 21/6838 294/185 |
| 8,881,380 | B2 | 11/2014 | Takayuki | |
| 2013/0160293 | A1 * | 6/2013 | Susumu | H05K 13/0408 29/890.09 |
| 2015/0181777 | A1 * | 6/2015 | Teraoka | H05K 13/028 414/752.1 |

FOREIGN PATENT DOCUMENTS

| JP | 08-018284 A | 1/1996 |
|---|---|---|
| JP | 3543044 B2 * | 7/2004 |

(Continued)

*Primary Examiner* — Gabriela Puig
(74) *Attorney, Agent, or Firm* — Sughrue Mion, PLLC

(57) ABSTRACT

There is provided a part holding head assembly of a part mounting device including: a rotary head; a spindle configured to rotate in a first direction T with respect to a central axis of the spindle and configured to move in a second direction Z substantially parallel with an extending direction of the central axis of the spindle; a nozzle provided at a first end of the spindle; a raising part configured to move the spindle to in the second direction Z; and a contact detecting sensor configured to sense the nozzle contacting a part or the part held by the nozzle contacting a substrate and configured to generate a contact sensing signal according to the sensing.

12 Claims, 8 Drawing Sheets

(56) References Cited

FOREIGN PATENT DOCUMENTS

| | | | |
|---|---|---|---|
| JP | 2007-173660 A | 7/2007 | |
| JP | 2008-078295 A | 4/2008 | |
| JP | 2010-010463 A | 1/2010 | |
| JP | 2013212220 A | * 10/2013 | |
| KR | 10-2012-0133976 A | 12/2012 | |

* cited by examiner

PART HOLDING HEAD ASSEMBLY FOR CHIP MOUNTING DEVICE

CROSS-REFERENCE TO RELATED APPLICATION

This application claims priority from Japanese Patent Application No. 2014-205016 filed on Oct. 3, 2014 and Japanese Patent Application No. 2014-205017 filed on Oct. 3, 2014 in the Japanese Patent Office the disclosures of which are incorporated herein in their entireties by reference.

BACKGROUND

1. Field

Apparatuses consistent with exemplary embodiments relate to a part holding head assembly for a chip mounting device, and more particularly, to a part holding head assembly of a part mounting device mounting an electronic part, the part holding head assembly including a nozzle configured to hold the electronic part such as an integrated circuit (IC) chip or the like, on a substrate.

2. Description of the Related Art

In the related art, a part mounting device moves a part holding head assembly above a part supply unit and enables a nozzle of the part holding head assembly to perform descending and ascending operations at that location. Thereafter, the part mounting device adsorbs a part at a lower end of the nozzle in a vacuum to pick up the part, moves the part holding head assembly above a substrate, and enables the nozzle to re-perform the descent or ascent operation so as to mount the part in a preset coordinate position of the substrate.

During the operation described above, if the descending and ascending operations of the nozzle are performed to pick up the part into the nozzle, and an ascent stroke of the nozzle is too strong, the lower end of the nozzle may press on an upper surface of the part with an extensive force and thus may break the part. If the descent stroke is too weak, the nozzle may fail to contact the upper surface of the part and thus may fail to pick up the part. Further, if the descent stroke of the nozzle is too strong, the part adsorbed at the lower end of the nozzle may be pressed with an extensive force and may be broken on the substrate. Meanwhile, if the descent stroke is too weak, the part held in the nozzle fails to contact the upper surface of the substrate and thus fails to mount the part. Therefore, the descent stroke of the nozzle should be accurately controlled.

As a method of accurately controlling an ascent/descent stroke of a nozzle, Japanese Patent No. 3543044 discloses a method of using a sensing unit (a contact detecting sensor) for sensing a contact of a nozzle.

As another method of accurately controlling a descent stroke of a nozzle, Japanese Patent Application No. 2013-212220 discloses a method of using a reflective light sensor (an optical fiber sensor) as a contact detecting sensor. The optical fiber sensor includes a light-emitting unit which emits light toward an outside reflective surface of the nozzle, a light-receiving unit that receives reflected light reflected from the outer reflective surface, and a sensor unit that continuously measures a received amount of reflected light. When the received amount decreases to be lower than or equal to a threshold value, the optical fiber sensor determines that the nozzle contacts a part to generate a contact sensing signal.

In other words, light emitted from the light-emitting unit of the optical fiber sensor is focused on the reflective surface before the nozzle contacts the part. Therefore, if upper and lower positions of the nozzle are changed due to a contact of the nozzle with the part, an amount of reflected light reflected from the reflective surface decreases, and an amount of light received by the light-receiving unit of the optical fiber sensor decreases. In the related art, an amount of received light by the light receiving unit is compared with a predetermined threshold value, and when the amount of received light by the light receiving unit decreases to be lower than or equal to the threshold value, the optical fiber sensor determines that the nozzle contacts the part and thus stops descending of the nozzle based on the determination.

In the related art, the threshold value is set to a fixed value based on a pre-experimental result using an optical fiber sensor. Therefore, each type of different nozzles requires the pre-experimental results on the threshold value A. Also, as a nozzle is used, foreign material may become stuck onto a reflective surface of the nozzle. Therefore, before the same nozzle contacts a part, an amount of received light may be changed as time elapses. If an amount of received light is changed according to a nozzle or a time elapse before a nozzle contacts a part as described above, and the threshold value A is set to a fixed value, the following problems occur.

If, for example, an amount of received light, which is measured before a nozzle contacts a part, is lower than the threshold value A, an optical fiber sensor erroneously determines that the nozzle contacts the part when the nozzle actually does not contact the part. In this case, before the nozzle actually contacts the part, a picking-up (adsorbing) operation or a mounting operation of the part starts, and thus a picking-up error or a mounting error occurs. Also, the nozzle may be in a state where a contact of the nozzle may not be sensed.

If, for example, an amount of received light is significantly higher than the threshold value before a nozzle contacts a part, the amount of received light does not each a value lower than or equal to the threshold value even after the nozzle contacts the part. Therefore, although the amount of received light decreases, the amount of received light takes a long time to reach the threshold value A. As a result, a long time is taken from when the nozzle contacts the part to when the nozzle stops, and thus the nozzle excessively presses on the part, and the part may be damaged. In other words, the pressing of the nozzle onto the part may not be accurately controlled.

A contact sensing function performed by an existing contact detecting sensor (or an optical fiber sensor) is not sufficient for an adaptability to a change in an amount of received light before the nozzle contacts the part due to a difference in a shapes or status of the nozzle or the like. In other words, a robust performance of contact sensing function is still desired.

Also, in the related art, an outside reflective surface of a nozzle may become dirty or a reflective plate may be installed to form a reflective surface in the nozzle. In this case, a sufficient amount of received light may not be acquired from before the nozzle contacts the part. Therefore, a contact of the nozzle may not be sensed or although the contact of the nozzle is sensed, an accuracy of the contact of the nozzle is lowered.

Therefore, an optical abnormality of a nozzle, cleanness of a reflective surface, uninstalling of the reflective surface, or the like, needs to be accurately sensed in real time to accurately sense a contact of the nozzle through a contact detecting sensor, such as an optical fiber sensor that is a reflective optical fiber sensor, or the like.

SUMMARY

One or more exemplary embodiments provide a part holding head of a part mounting device including a contact detecting sensor sensing a contact of a nozzle to improve a robust performance of a contact sensing function of the contact detecting sensor.

One or more exemplary embodiments provide a part holding head of a surface mounting device including a contact detecting sensor sensing a contact of a nozzle to accurately sense an optical abnormality of a part holding unit interfering with contact sensing of the contact detecting sensor online.

Additional aspects will be set forth in part in the description which follows and, in part, will be apparent from the description, or may be learned by practice of the presented exemplary embodiments.

According to an aspect of an exemplary embodiments, there is provided a part holding head assembly of a part mounting device including a holding head, a spindle configured to rotate in direction T with respect to a central axis of the holding head and ascend in direction Z following a longitudinal direction of the central axis of the holding head, a nozzle configured to be installed at a lower end of the spindle through an elastic body, a raising part configured to enable the spindle to ascend in the direction Z, and a contact detecting sensor configured to operate with the raising part to enable the raising part to ascend in the direction Z and sense that the nozzle contacts a part or the part held by the nozzle contacts a substrate so as to generate a contact sensing signal. The contact detecting sensor may include a light-emitting unit configured to emit light toward an outer reflective surface of the nozzle, a light-receiving unit configured to receive reflected light reflected from the outer reflective surface, and a sensor unit configured to continuously measure a received amount of the reflected light and generate the contact sensing signal when the received amount of the reflected light decreases to be lower than or equal to a threshold value, wherein the contact detecting sensor sets the threshold value based on the received amount of the reflected light after ending a T-direction rotation operation of the spindle before the nozzle to be sensed contacts the part.

Whenever performing an operation of enabling the nozzle to contact the part, the contact detecting sensor may set the threshold value based on the received amount of the reflected light after ending the T-direction rotation operation of the spindle before the nozzle contacts the part.

A plurality of spindles may be disposed along a circumferential direction of a rotary head configured to be installed so as to rotate in direction R with respect to the central axis of the holding head. The contact detecting sensor may set the threshold value based on the received amount of the reflected light after ending the T-direction and R-direction rotation operations of the spindle before the nozzle to be sensed contacts the part.

Whenever an operation of enabling the nozzle to contact the part, the contact sensing sensor may set the threshold value based on the received amount of the reflected light after ending the T-direction and R-direction rotation operations of the spindle before the nozzle contacts the part.

In descriptions of exemplary embodiments, "a contact of a nozzle" is a concept that includes all of an operation of enable a lower end of the nozzle to contact an upper surface of a part and an operation of enable the part held at the lower end of the nozzle to contact an upper surface of a substrate. Therefore, even if only the operation of enabling the nozzle to contact the part is described in relation to "the contact of the nozzle", it is understood that "the contact of the nozzle" is equally applied to the operation of enabling the part held at the nozzle to contact the substrate. Also, "the contact" of the nozzle may be used as the term "landing".

According to an aspect of an exemplary embodiments, there is provided a part holding head assembly of a part mounting device including: a rotary head; a spindle configured to rotate in a first direction T with respect to a central axis of the spindle and configured to move in a second direction Z substantially parallel with an extending direction of the central axis of the spindle; a nozzle provided at a first end of the spindle; a raising part configured to move the spindle to in the second direction Z; and a contact detecting sensor configured to sense the nozzle contacting a part or the part held by the nozzle contacting a substrate and configured to generate a contact sensing signal according to the sensing, wherein the contact detecting sensor may include: a light-emitting unit configured to emit light toward an outer reflective surface of the nozzle; a light-receiving unit configured to receive reflected light reflected from the outer reflective surface; and a sensor unit configured to measure a received amount of the reflected light and to generate the contact sensing signal in response to the received amount of the reflected light decreases to be lower than or equal to a threshold value, and wherein the contact detecting sensor is configured to set the threshold value based on an amount of the reflected light received by the light receiving unit after completion of a T-direction rotation operation of the spindle before the nozzle contacts the part.

The contact detecting sensor may be configured to set the threshold value based on the received amount of the reflected light after the completion of the T-direction rotation operation of the spindle before the nozzle contacts the part at each time the raising part moves the nozzle to contact the part or move the part held by the nozzle to contact the substrate.

The contact detecting sensor may be configured to generate an abnormality signal in response to the received amount of the reflected light exceeding a preset range and configured to set the threshold value in response to the received amount of the reflected light being in the preset range, the received amount of the reflected light being measured after the completion of the T-direction rotation operation of the spindle.

The spindle may include a plurality of spindles, the plurality of spindles provided along a circumferential direction of the rotary head and configured to rotate in a third direction R with respect to a central axis of the rotary head, and the contact detecting sensor may be configured to set the threshold value based on the received amount of the reflected light after completion of the T-direction rotation and R-direction rotation operations of the spindle before the nozzle contacts the part.

The contact sensing sensor may be configured to set the threshold value based on the received amount of the reflected light after the completion of the T-direction rotation and R-direction rotation operations of the spindle before the nozzle contacts the part at each time the raising part moves the nozzle to contact the part or move the part held by the nozzle to contact the substrate.

The contact detecting sensor may be configured to generate an abnormality signal in response to the received amount of the reflected light exceeding a preset range and configured to set the threshold value in response to the received amount of the reflected light being in the preset range, the received amount of the reflected light being measured after the completion of the T-direction rotation and R-direction rotation operations of the spindle before the nozzle contacts the part.

The part holding head assembly may further include: a raising controller configured to control a movement of the raising part so as to control a corresponding movement of the nozzle, wherein the raising controller may be configured to control the movement of the nozzle with a movement profile heading toward a preset target contact position, and in response to the raising controller receiving the abnormality signal, the raising controller may be configured to control the nozzle to move in a direction away from the part when the nozzle reaches the target contact position regardless of the contact sensing signal being received.

The contact detecting sensor may be configured to set the threshold value based on the received amount of the reflected light measured at a measured position along a circumferential direction of the outer reflective surface, the measured position corresponding to a final position along the circumferential direction of the outer reflective surface sensed by the contact detecting sensor when the nozzle contacts the part.

The contact detecting sensor may be fixedly attached to the raising part.

The contact detecting sensor may be configured to emit the light toward the outer reflective surface of the nozzle at an intersecting direction of the second direction.

An elastic body may be provided between the nozzle and the spindle.

The contact detecting sensor may be configured to determine whether the nozzle contacts the part based on a comparison between the threshold value and an amount of the reflected light received by the light-receiving unit at a final position along a circumferential direction of the outer reflective surface sensed by the contact detecting sensor when the nozzle contacts the part.

BRIEF DESCRIPTION OF THE DRAWINGS

The above and/or other aspects of the disclosure will become apparent and more readily appreciated from the following description of the exemplary embodiments, taken in conjunction with the accompanying drawings in which.

DETAILED DESCRIPTION

Figure 1:
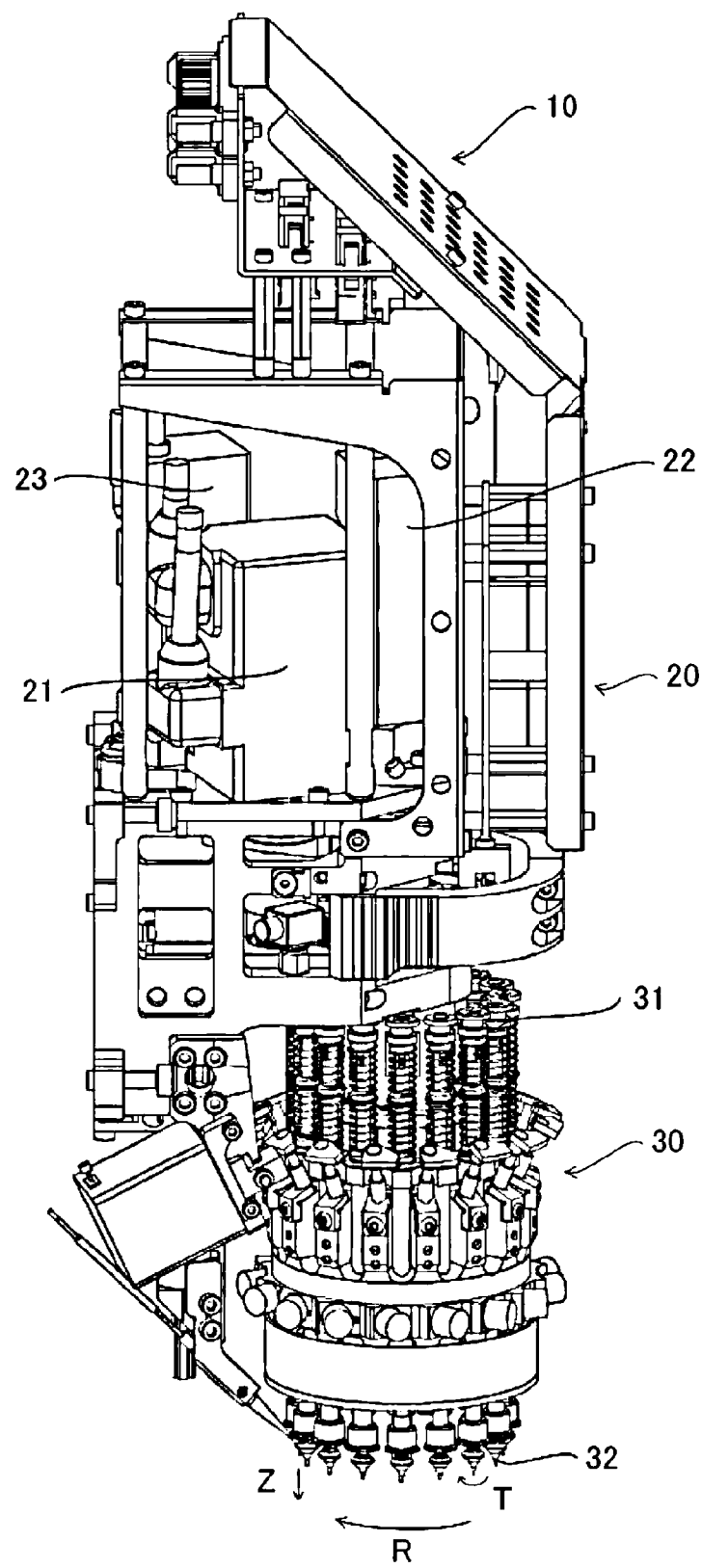
FIG. 1 is a perspective view of a structure of a part holding head assembly according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description.

FIG. 1 is a perspective view of a structure of a part holding head assembly 10 according to an exemplary embodiment.

In the part holding head assembly 10 of a part mounting device according to the exemplary embodiment, a rotary head 30 is a rotary head type part holding head and is installed in a head body 20, which is fixedly disposed, to rotate in a first rotational direction R with respect to a central axis of the head body 20. A plurality of spindles 31 are disposed in the rotary head 30 at equal intervals along a circumferential direction thereof, and nozzles 32 are respectively installed at lower ends of the plurality of spindles 31 to adsorb a part 60.

The rotary head 30 rotates in the first rotational direction R due to driving of an R servo motor 21 installed in the head body 20. The spindles 31 rotate in a second rotational direction T around an axis of a T servo motor 22 due to driving of the T servo motor 22.

Also, a Z servo motor 23 is disposed in the head body 20 to move a selected spindle 31a of the plurality of spindles 31, which is installed in a particular position, in a vertical direction Z (i.e., a gravitational direction) corresponding to a longitudinal direction of the selected spindle 31a. A device that rotates the rotary head 30 in the first rotational direction R due to driving of the R servo motor 21 and a device that rotates each of the plurality of spindles 31 in the direction T due to driving of the T servo motor 22 are well known, and thus descriptions of such devices are omitted. A device that moves the selected spindle 31a to descend/ascend due to driving of the Z servo motor 23 will now be described.

Figure 2:
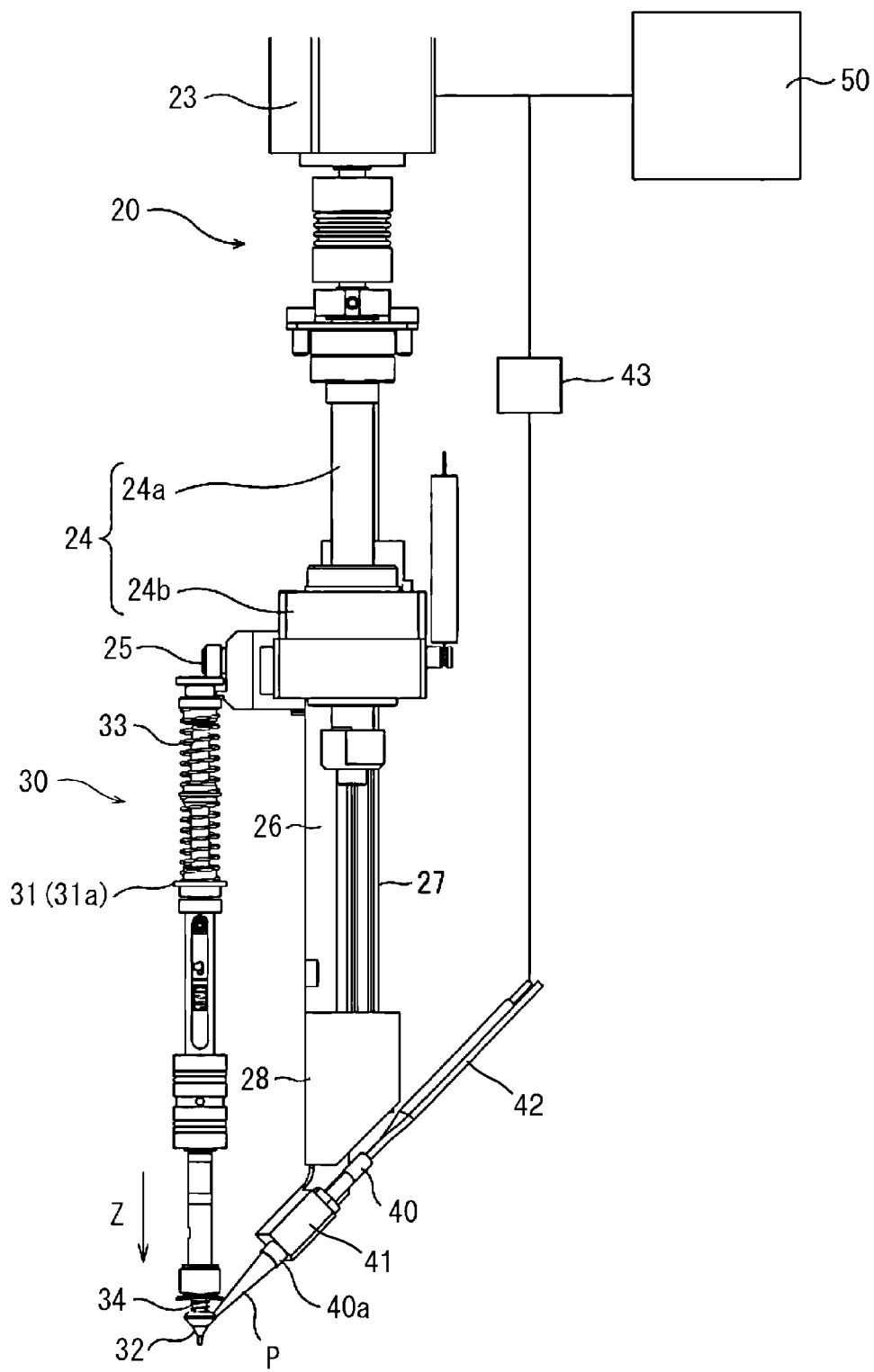
FIG. 2 illustrates a device that enables a spindle (or a nozzle) to ascend and/or descend in a vertical direction in the part holding head assembly of FIG. 1.

FIG. 2 illustrates a device that moves a selected spindle 31a having a nozzle 32 to ascend/descend in the vertical direction Z in the part holding head assembly 10 of FIG. 1.

FIG. 2 illustrates a device that moves the selected spindle 31a to ascend/descend in the vertical direction Z in the part holding head assembly 10 of FIG. 1. A motor shaft of the Z servo motor 23 disposed in the head body 20 is connected to a screw shaft 24a of a ball screw device 24, and a nut 24b is installed at the screw shaft 24a. A raising part 25 is connected to the nut 24b. Therefore, the nut 24b and the raising part 25 move together in the vertical direction Z in response to driving of the Z servo motor 23.

The raising part 25 is provided on a side of the head body 20. Before the selected spindle 31a is moved in the vertical direction Z, the rotary head 30 including the plurality of spindles 31 rotates relatively with respect to the raising part 25 to select a selected spindle 31a of the plurality of the spindles disposed in a particular position and move the raising part 25 in the vertical direction Z so as to move the selected spindle 31a in the vertical direction Z.

Figure 3:
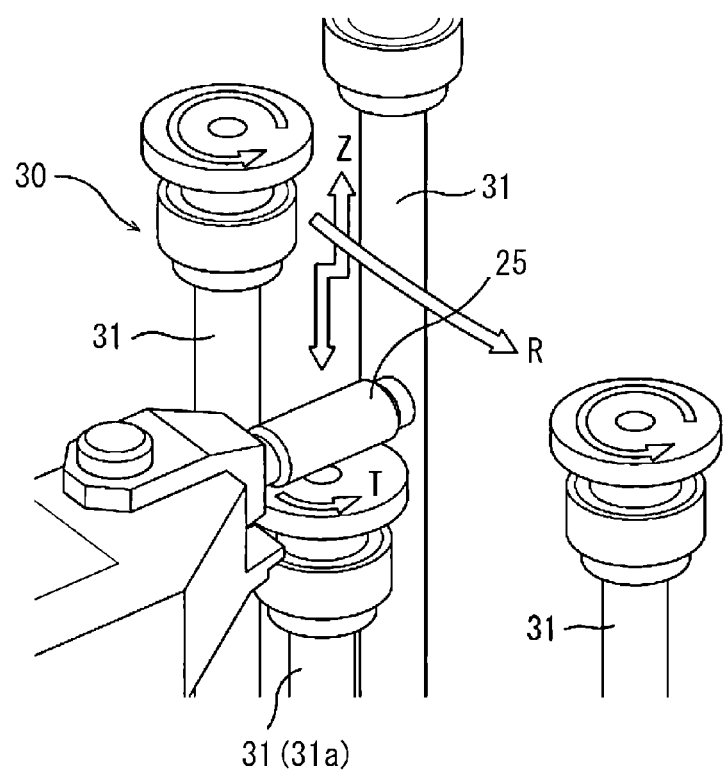
FIG. 3 illustrates an element disposed around a raising part that enables the spindle (or the nozzle) of FIG. 2 to ascend and/or descend in a vertical direction.

FIG. 3 illustrates an element disposed around a raising part 25 that enables the spindle 31 (or the nozzle) of FIG. 2 to move in the vertical direction Z.

In the exemplary embodiment, as shown in FIG. 3, the rotary head 30 is rotated in the first rotational direction R to move the plurality of spindles 31 with respect to the raising part 25 and enables a selected spindle 31a of the plurality of spindles 31, which is positioned directly below the raising part 25, to descend/ascend in the vertical direction Z. However, the selected spindle 31a of the plurality of spindles 31 disposed in the particular position along the circumferential direction of the rotary head 30 to ascend/descend is not particularly limited thereto. For example, the part holding head assembly 10 of a part mounting device may move a raising part 25 to select a spindle 31a to be descended/ascended. Also, the particular position may be two or more depending on the design of the part holding head assembly 10 including the raising part 25.

Referring back to FIG. 2, an optical fiber sensor 40, which is an example of a contact detecting sensor, is connected to the nut 24b, to which the raising part 25 is connected, through a connection bar 26 and a spline nut 28 installed at a spline shaft 27 fixedly provided in the head body 20. In other words, the optical fiber sensor 40 is fixedly attached to the raising part 25 via the spline nut 28, the spline shaft 27 and connection bar 26. Therefore, if the raising part 25 moves in the vertical direction Z due to driving of the Z servo motor 23, the optical fiber sensor 40 moves along together with the raising part 25 in the vertical direction Z. Here, "the moving of the optical fiber sensor 40 together with the raising part 25" means that the optical fiber sensor 40 and the raising part 25 are mechanically formed into one body to move together or to be driven by different driving units but the optical fiber sensor 40 and the raising part 25 move at the same speed as illustrated in FIGS. 4A and 4B.

Figure 4A:
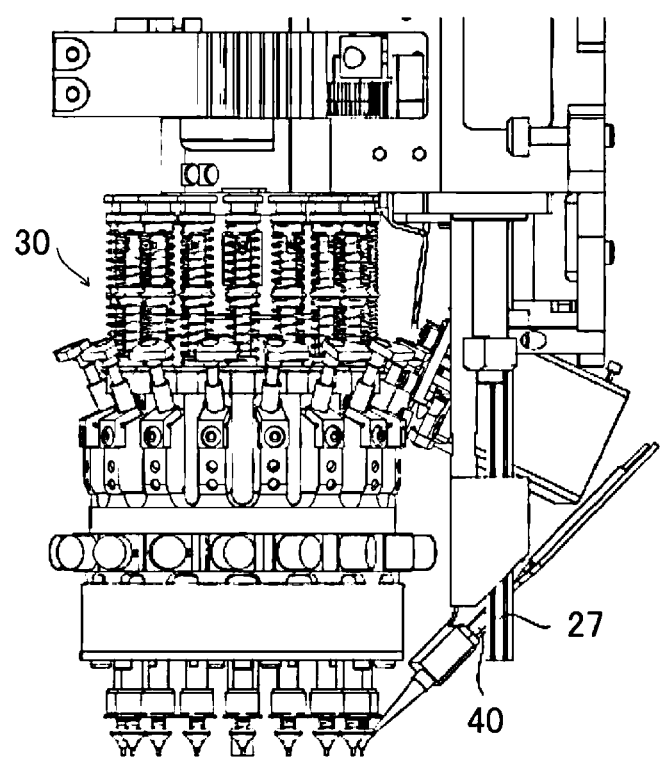
FIG. 4A illustrates a rotary head including a plurality of spindles that is in an initial position.
Figure 4B:
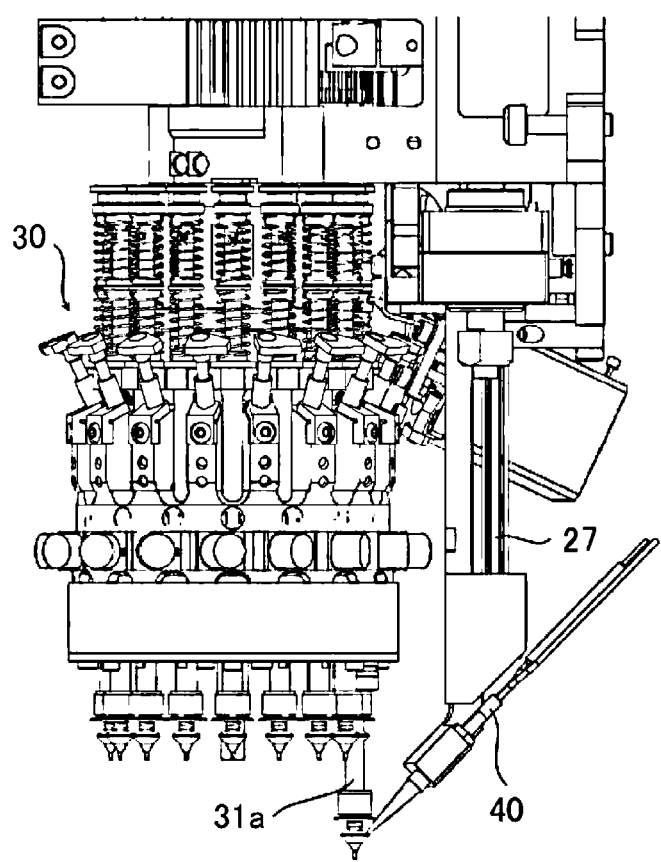
FIG. 4B illustrates a selected spindle of the plurality of spindles descending in the vertical direction.

FIGS. 4A and 4B illustrate the selected spindle 31a with the nozzle 32 attached thereto that is moved (e.g., the selected spindle 31a descends) by the raising part 25 of FIG. 2. FIG. 4A illustrates the spindle 31a that is in an initial position. FIG. 4B illustrates the selected spindle 31a of the plurality of spindles 31 that descends by the raising part 25 of FIG. 2. Also, the selected spindle 31a is constantly biased to the initial position as shown in FIG. 4A by an elastic body 33 (refer to FIG. 2) formed of two coil springs.

Figure 5:
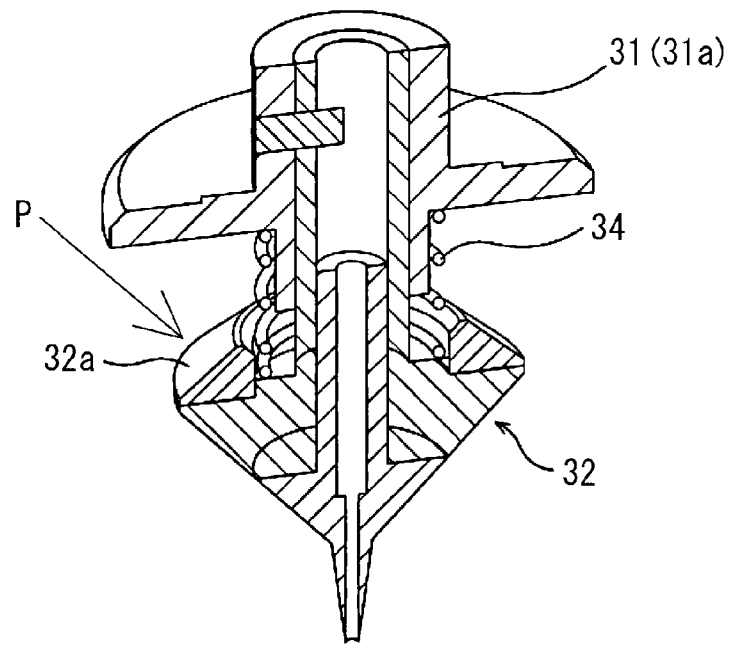
FIG. 5 is an enlarged perspective view of a cross-section of a nozzle installed at a lower end of each of a plurality of spindles.
Figure 6:
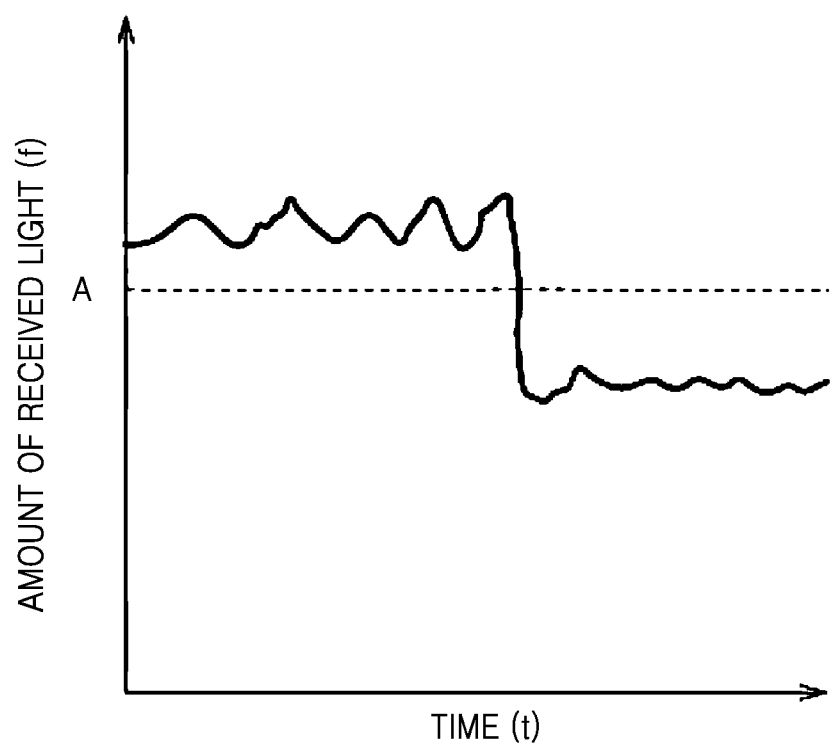
FIG. 6 is a graph schematically illustrating changes in an amount of received light of an optical fiber sensor when a nozzle contacts a part.
Figure 7:
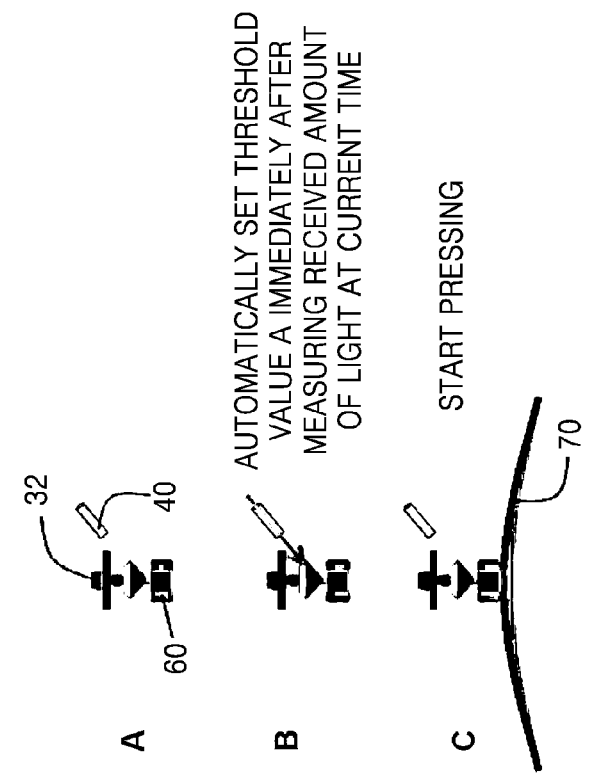
FIG. 7 illustrates a method of setting a threshold value in the part holding head assembly of FIG. 1.
Figure 7:
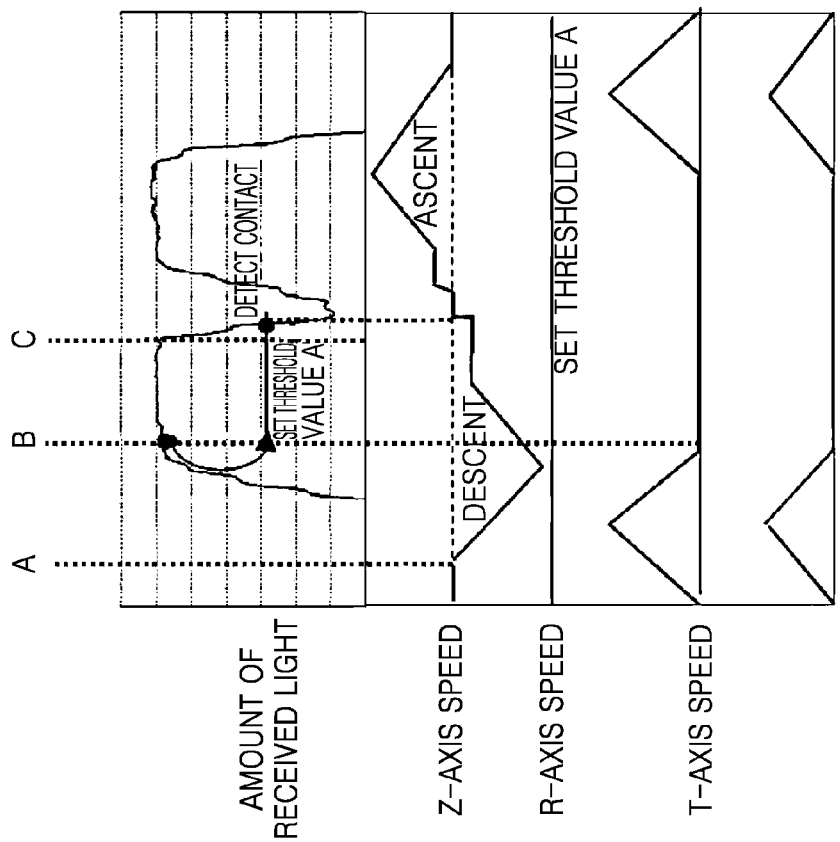

FIG. 5 is an enlarged perspective view of a cross-section of a nozzle 32 installed at a lower end of each of a plurality of spindles 31. FIG. 6 is a graph schematically illustrating changes in an amount of received light of an optical fiber sensor 40 when the nozzle 32 contacts a part 60 (FIG. 7).

A light-emitting unit 41 and a light-receiving unit 42 are assembled together with an optical fiber or a lens 40a on the same shaft line to form the optical fiber sensor 40, and the optical fiber sensor 40 is well known. In the exemplary embodiment, as shown in FIG. 2, the optical fiber sensor 40 is disposed above the nozzle 32 to be slanted or inclined with respect to the vertical direction Z, wherein the nozzle 32 is installed at the lower end of each of the plurality of spindles 31. In the exemplary embodiment, a coil spring 34 (or an elastic member) is provided between the nozzle 32 and each of the plurality of spindles 31. The light-emitting unit 41 of the optical fiber sensor 40 emits light P toward a reflective surface 32a of the nozzle 32. The emitted light P from the light-emitting unit 41 is reflected by the reflective surface 32a of the nozzle 32 and is received by the light-receiving unit 42 of the optical fiber sensor 40.

Here, as described above, the nozzle 32 is installed at the lower end of each of the plurality of spindles 31 through the coil spring 34. Here, if the nozzle 32 installed at the lower end of the spindle 31 contacts the spindle 31 due to the vertical movement of the selected spindle 31a, the coil spring 34 is compressed and the position of the nozzle 32 is changed with respect to the spindle 31. In detail, the nozzle 32 relatively moves toward the lower end of the spindle 31.

"The contact of the nozzle 32" means that a force is applied at a lower part of the nozzle 32. This case includes a case where the nozzle 32 moves downwards in a process of picking up a part, and then the lower part of the nozzle 32 contacts an upper surface of the part and a case where the part adsorbed by the lower part of the nozzle 32 contacts an upper surface of a substrate in a process of mounting the part.

The light P emitted from the light-emitting unit 41 of the optical fiber sensor 40 is focused by a lens 40a of FIG. 2 on the reflective surface 32a before the nozzle 32 moves toward the spindle 31 and contacts the spindle 31. Therefore, if the nozzle 32 moves toward the spindle 31 and contacts the spindle 31, and thus the position of the nozzle 32 is changed with respect to the spindle 31, an amount of reflected light reflected from the reflective surface 32a may change (i.e., decreases), and an amount of received light received by the light-receiving unit 42 of the optical fiber sensor 40 may also change (i.e., decreases) as illustrated in FIG. 6. In the exemplary embodiment, the decrease in the amount of received light is sensed by a sensor unit 43 of the optical fiber sensor 40.

Also, the sensor unit 43 continuously measures the amount of received light, and when the amount of received light is determined to be lower than or equal to a threshold value A as illustrated in FIG. 6, the sensor unit 43 determines that the nozzle 32 contacts the spindle 31 and generates a contact sensing signal.

FIG. 7 illustrates a method of setting a threshold value A in the part holding head assembly 10 of FIG. 1.

A method of setting the threshold value A in a part holding head assembly 10 according to an exemplary embodiment will now be described with reference to FIG. 7. Also, FIG. 7 illustrates a process of mounting a part 60 on a substrate 70, but the method of setting the threshold value A is the same for a process of picking up a part 60.

As shown in FIG. 7, a Z-direction (i.e., a vertical direction) descending operation (or Z-axis descending) of the nozzle 32 starts at time A. In an initial step of the Z-axis descending operation, the nozzle 32 simultaneously performs a T-direction rotation operation (or a T-axis rotation) and an R-direction rotation operation (or an R-axis rotation) described in FIG. 3 to descend.

The sensor unit 43 of the optical fiber sensor 40 automatically sets the threshold value A based on an amount of received light actually measured immediately after the T-axis rotation and the R-axis rotation are completed (at time B of FIG. 7) before the nozzle 32 to be sensed contacts the part and determines whether the nozzle 32 contacts the part, based on the threshold value A. In an example of FIG. 7, the amount of received light is lower than or equal to the threshold value A at time C, and thus the sensor unit 43 determines that the nozzle 32 contacts the part at the time C. The setting of the threshold value A is repeated in each operation of mounting (picking up) a part by the nozzle 32, and the threshold value A is updated on each case (e.g., at each descending operation).

If the amount of received light exceeds an allowable range at the time B, the optical fiber sensor 40 determines that an optical abnormality occurs in the nozzle 32 and generates an abnormality signal. If a controller 50 (a raising controlling unit of FIG. 2) that controls the Z servo motor 23 receives the abnormality signal, the controller 50 controls the Z servo motor 23 so as to move the selected spindle 31a having the nozzle 32 in an ascending direction if the nozzle 32 reaches a target contact position regardless of whether to receive the contact sensing signal.

Here, the target contact position is set based on device configuration data of a surface mounting device, data about heights of a substrate and a part, or the like and is pre-given with respect to the controller 50. The controller 50 controls the Z servo motor 23 to control the descent of the nozzle 32 with a descent profile (e.g., a Z-axis speed profile as shown in FIG. 7) heading toward the target contact position.

In the exemplary embodiment, the controller 50 (or the Z servo motor 23) uses the reception of the contact sensing signal as a trigger as shown in FIG. 7 and stops descending of the nozzle 32 in consideration of a necessary amount of pressing force on the part 60. However, if the controller 50 receives the abnormality signal indicating the optical abnormality of the optical fiber sensor 40, an accurate contact sensing signal may not be acquired. Therefore, the controller 50 (or the Z servo motor 23) moves the selected spindle 31a having the nozzle 32 in the ascending direction if the nozzle 32 reaches the target contact position regardless of whether to receive the contact sensing signal. Therefore, the nozzle 32 may be prevented from descending excessively.

A control program of the part holding head assembly 10 may control a timing of determining whether the nozzle 32 has the optical abnormality and a timing of ending the T-axis rotation and the R-axis rotation for setting the threshold value A. In practice, for example, determining the time B of FIG. 7 (timing of time B) may be determined based on an encoder value of the Z servo motor 23 that enables the nozzle 32 to ascend.

The controller 50 may determine whether the optical abnormality occurs in the nozzle 32, based on an amount of received light actually measured after ending the T-axis and R-axis rotations, to accurately sense the optical abnormality of the nozzle 32. In other words, if foreign material is stuck onto a part of a T-direction circumference of the reflective surface 32a of the nozzle 32, the foreign material affects the amount of received light according to a T-direction position of the nozzle 32. Therefore, the controller 50 may measure an amount of received light before the nozzle 32 contacts the part 60, in the same position as a final position of the nozzle 32 taken when the nozzle 32 contacts the part, to accurately sense the optical abnormality of the nozzle 32.

The controller 50 may set the threshold value A based on the amount of received light actually measured after ending the T-axis and R-axis rotations to set a best threshold value A in each nozzle 32 that is an object to be sensed. In other words, if the T-axis and R-axis rotations are completed, a position of a rotation direction of the nozzle 32 becomes equal to the final position taken when the nozzle 32 contacts the part. The threshold value A is set based on the amount of received light measured before the nozzle 32 contacts the part when the position of the nozzle 32 is equal to the final position. Therefore, the threshold value A is best as a determination reference value for sensing contact using a decrease in an amount of received light. Also, as described above, the controller 50 determines whether the nozzle 32 contacts the part, by using the threshold value A set in each nozzle 32. Therefore, although an amount of received light measured before the nozzle 32 contacts the part is changed according to a difference in shapes or status of the nozzle 32 or the like, the threshold value A is set in real time so as to improve a robust performance of a contact sensing function of the optical fiber sensor 40.

Although the amount of received light measured before the nozzle 32 contacts the part decreases due to the foreign material sticking on the nozzle 32 or the like as time elapses, an accurate threshold value A is set according to an amount of received light measured whenever the nozzle 32 is used. That is, threshold value A is set in real time during the operation. Therefore, the robust performance may be improved, and an available period of the nozzle 32 may be extended. If the threshold value A is a fixed value, and the amount of received light measured before the nozzle 32 contacts the part decreases, the above-described problems occur. Therefore, the nozzle 32 may be replaced with a new one in an initial stage. In the above-described structure, the part mounting device including the part holding head assembly 10 adsorbs and picks up a part from a part supply unit through the nozzle 32 installed at the lower end of the spindle 31 to transfer the part onto a print board and mount the part on a preset position of the print board. When adsorbing and mounting the part, the sensor unit 43 of the optical fiber sensor 40 determines whether the nozzle 32 contacts the part, based on the threshold value A set in each nozzle 32 according to the above-described method. If the contact of the nozzle 32 is sensed, the sensor unit 43 generates a contact sensing signal. The contact sensing signal is transmitted to the controller 50 (or a controlling unit) of FIG. 2. If the controller 50 receives the contact sensing signal, the controller 50 stops the Z servo motor 23 that enables the raising part 25 to descend. As a result, a descent stroke of the nozzle 32 is accurately controlled so as to enable the nozzle 32 to accurately contact the part.

In the above-described exemplary embodiment, the sensor unit 43 of the optical fiber sensor 40 is installed separately from the controller 50, but a function of the sensor unit 43 may be assembled with the controller 50. Also, in addition to the optical fiber sensor 40, a reflective optical sensor may be used as the contact detecting sensor. In addition, the exemplary embodiment may be applied a rotary head type and a part holding head, i.e., a part holding head that does not accompany an R-direction rotation operation. In this case, the sensing of the optical abnormality of the nozzle 32 and the setting of the threshold value A are performed after ending the T-axis rotation.

In a part holding head assembly of a part mounting device according to exemplary embodiments as described above, a threshold value of an amount of received light that is a standard of contact sensing is set based on an amount of received light actually measured before a nozzle to be sensed contacts a part. Also, a measurement of an amount of received light used for setting the threshold value is performed after ending T-direction and R-direction rotation operations. In other words, the setting of the threshold value is performed before the nozzle contacts the part in the same position (or a rotation direction position) as a final position taken when the nozzle contacts the part.

Therefore, a robust performance of a contact sensing function of a contact detecting sensor may be improved. Also, a descent stroke of the nozzle holding the part may be further accurately controlled.

While exemplary embodiments have been particularly shown and described above, it will be understood by those of ordinary skill in the art that various changes in form and details may be made therein without departing from the spirit and scope of the inventive concept as defined by the following claims.

What is claimed is:

1. A part holding head assembly of a part mounting device comprising:
   a rotary head;
   a spindle configured to rotate in a first direction T with respect to a central axis of the spindle and configured to move in a second direction Z substantially parallel with an extending direction of the central axis of the spindle;
   a nozzle provided at a first end of the spindle;
   a raising part configured to move the spindle in the second direction Z; and
   a contact detecting sensor configured to sense the nozzle contacting a part or the part held by the nozzle contacting a substrate and configured to generate a contact sensing signal according to the sensing,
   wherein the contact detecting sensor comprises:
      a light-emitting unit configured to emit light toward an outer reflective surface of the nozzle;
      a light-receiving unit configured to receive reflected light reflected from the outer reflective surface; and
      a sensor unit configured to measure a received amount of the reflected light and to generate the contact sensing signal in response to the received amount of the reflected light decreases to be lower than or equal to a threshold value, and
   wherein the contact detecting sensor is configured to set the threshold value based on an amount of the reflected light received by the light receiving unit after completion of a T-direction rotation operation of the spindle before the nozzle contacts the part.

2. The part holding head assembly of claim 1, wherein the contact detecting sensor is configured to set the threshold value based on the received amount of the reflected light after the completion of the T-direction rotation operation of the spindle before the nozzle contacts the part at each time the raising part moves the nozzle to contact the part or move the part held by the nozzle to contact the substrate.

3. The part holding head assembly of claim 1, wherein the contact detecting sensor is configured to generate an abnormality signal in response to the received amount of the reflected light exceeding a preset range and configured to set the threshold value in response to the received amount of the reflected light being in the preset range, the received amount of the reflected light being measured after the completion of the T-direction rotation operation of the spindle.

4. The part holding head assembly of claim 3, further comprising:
   a raising controller configured to control a movement of the raising part so as to control a corresponding movement of the nozzle,
   wherein the raising controller is configured to control the movement of the nozzle with a movement profile heading toward a preset target contact position, and
   in response to the raising controller receiving the abnormality signal, the raising controller is configured to control the nozzle to move in a direction away from the part when the nozzle reaches the target contact position regardless of the contact sensing signal being received.

5. The part holding head assembly of claim 1, wherein the spindle comprises a plurality of spindles, the plurality of spindles provided along a circumferential direction of the rotary head and configured to rotate in a third direction R with respect to a central axis of the rotary head, and
   wherein the contact detecting sensor is configured to set the threshold value based on the received amount of the reflected light after completion of the T-direction rotation and R-direction rotation operations of the spindle before the nozzle contacts the part.

6. The part holding head assembly of claim 5, the contact sensing sensor is configured to set the threshold value based on the received amount of the reflected light after the completion of the T-direction rotation and R-direction rotation operations of the spindle before the nozzle contacts the part at each time the raising part moves the nozzle to contact the part or move the part held by the nozzle to contact the substrate.

7. The part holding head assembly of claim 5, wherein the contact detecting sensor is configured to generate an abnormality signal in response to the received amount of the reflected light exceeding a preset range and configured to set the threshold value in response to the received amount of the reflected light being in the preset range, the received amount of the reflected light being measured after the completion of the T-direction rotation and R-direction rotation operations of the spindle before the nozzle contacts the part.

8. The part holding head assembly of claim 1, wherein the contact detecting sensor is configured to set the threshold value based on the received amount of the reflected light measured at a measured position along a circumferential direction of the outer reflective surface, the measured position corresponding to a final position along the circumferential direction of the outer reflective surface sensed by the contact detecting sensor when the nozzle contacts the part.

9. The part holding head assembly of claim 1, wherein the contact detecting sensor is fixedly attached to the raising part.

10. The part holding head assembly of claim 1, wherein the contact detecting sensor is configured to emit the light toward the outer reflective surface of the nozzle at an intersecting direction of the second direction.

11. The part holding head assembly of claim 1, wherein an elastic body is provided between the nozzle and the spindle.

12. The part holding head assembly of claim 1, wherein the contact detecting sensor is configured to determine whether the nozzle contacts the part based on a comparison between the threshold value and a amount of the reflected light received by the light-receiving unit at a final position along a circumferential direction of the outer reflective surface sensed by the contact detecting sensor when the nozzle contacts the part.

* * * * *